(12) United States Patent
Zhou et al.

(10) Patent No.: US 10,578,654 B2
(45) Date of Patent: Mar. 3, 2020

(54) APPARATUS AND METHODS FOR PROCESSING SENSED CURRENT

(71) Applicant: TEXAS INSTRUMENTS INCORPORATED, Dallas, TX (US)

(72) Inventors: Siyuan Zhou, Bedford, NH (US); Michael James Munroe, Auburn, NH (US); Stephen Isaac Brink, Manchester, NH (US)

(73) Assignee: Texas Instruments Incorporated, Dallas, TX (US)

( * ) Notice: Subject to any disclaimer, the term of this patent is extended or adjusted under 35 U.S.C. 154(b) by 112 days.

(21) Appl. No.: 15/858,564

(22) Filed: Dec. 29, 2017

(65) Prior Publication Data

US 2019/0204366 A1 Jul. 4, 2019

(51) Int. Cl.
*G01R 19/18* (2006.01)
*G01R 19/25* (2006.01)
(Continued)

(52) U.S. Cl.
CPC ..... *G01R 19/2509* (2013.01); *G01R 19/2513* (2013.01); *H02M 3/158* (2013.01); *H02M 2001/0009* (2013.01)

(58) Field of Classification Search
CPC .... H02M 3/157; H02M 3/158; H02M 3/1584; H02M 3/156; H02M 3/33507; H02M 3/33561; H02M 2001/0006; H02M 2001/0025; H02M 3/33569; H02M 2001/0012; H02M 3/33515; H02M 3/3376; H02M 1/15; H02M 2001/0003; H02M 2001/0029; H02M 2001/0032; H02M 2001/0038; H02M 2001/0048; H02M 2001/008; H02M 7/53873; G01R 19/0092; G01R 31/40; G01R 19/0023; G01R 19/0038; G01R 19/25; G01R 19/2506;
(Continued)

(56) References Cited

U.S. PATENT DOCUMENTS 6,343,026 B1 * 1/2002 Perry .................... H02M 3/285
323/272
6,977,824 B1 * 12/2005 Yang .................. H02M 3/33507
363/21.16
(Continued)

OTHER PUBLICATIONS

Search Report for PCT Application No. PCT/US18/68128 dated Apr. 18, 2019, 1 page.

*Primary Examiner* — Vinh P Nguyen
(74) *Attorney, Agent, or Firm* — Tuenlap Chan; Charles A. Brill; Frank D. Cimino

(57) ABSTRACT

A device for averaging a sensed current includes a sampling circuit that samples at least two sampling points of each cycle of a front-end alternating current (AC) sensed signal. The two sampling points is substantially symmetrical with respect to a midpoint of each respective cycle of the front-end AC sensed signal. The device also includes a timing circuit that controls a timing of the sampling circuit to sample the front-end AC sensed signal on the at least two sampling points based on a timing signal generated by the timing circuit. The device further includes an averaging circuit that averages the two sampling points for a given cycle of the front-end AC sensed signal to produce an average sensed current.

17 Claims, 5 Drawing Sheets

(51) Int. Cl.
*H02M 3/158* (2006.01)
*H02M 1/00* (2006.01)

(58) Field of Classification Search
CPC ........ G01R 19/22; G01R 1/203; G01R 1/206; G01R 31/42
See application file for complete search history.

(56) References Cited

U.S. PATENT DOCUMENTS

| | | |
|---|---|---|
| 9,186,110 B2 | 11/2015 | Rodriguez-Llorente et al. |
| 2004/0080316 A1 | 4/2004 | Friend et al. |
| 2009/0058387 A1* | 3/2009 | Huynh .............. H02M 3/33523 323/282 |
| 2009/0058389 A1* | 3/2009 | Yang ................. H02M 3/33507 323/301 |
| 2011/0121833 A1 | 5/2011 | Sambandamurthy et al. |
| 2017/0047843 A1 | 2/2017 | Bawa |

\* cited by examiner

APPARATUS AND METHODS FOR PROCESSING SENSED CURRENT

TECHNICAL FIELD

This disclosure relates generally to processing sensed current.

SUMMARY

One example includes a sampling circuit configured to sample at least two sampling points of each cycle of a front-end alternating current (AC) sensed signal, the at least two sampling points being substantially symmetrical with respect to a midpoint of each respective cycle of the front-end AC sensed signal. The device is further includes a timing circuit configured to control a timing of the sampling circuit to sample the front-end AC sensed signal on the at least two sampling points based on a timing signal generated by the timing circuit. The device yet further includes an averaging circuit that averages the at least two sampling points for a given cycle of the front-end AC sensed signal to produce an average sensed current.

An example includes a method that includes sampling at least two sampling points of each cycle of a front-end alternating current (AC) sensed signal. The method further includes controlling timing of the sampling of the front-end AC sensed signal such that the at least two sampling points are substantially symmetrical with respect to a midpoint of each respective cycle of the front-end AC sensed signal. The method yet further includes averaging the at least two sampling points cycle-by-cycle to produce an average sensed current.

An example includes a device that includes first and second switches that switch opposite each other, the first switch configured to apply a front-end alternating current (AC) sense signal to a first capacitor, the second switch activated opposite the first switch to couple the first capacitor to a second capacitor to transfer charge from the first capacitor to the second capacitor. The device further includes third and fourth switches that switch opposite each other, the third switch configured to applying the front-end AC sensed signal to a third capacitor and deactivated to remove application of the front-end AC sensed signal to the third capacitor, the fourth switch activated to couple the third capacitor to a fourth capacitor to transfer charge from the third capacitor to the fourth capacitor. The device yet further includes first and second amplifiers coupled to the second and fourth capacitors, respectively, to amplify a signal from the second and fourth capacitors and provide respective first and second amplified output signals. The device even further includes a voltage divider circuit, coupled between outputs of the first and second amplifiers, configured to provide an output signal corresponding to an average current based on the first and second amplified output signals.

DETAILED DESCRIPTION

Figure 1:
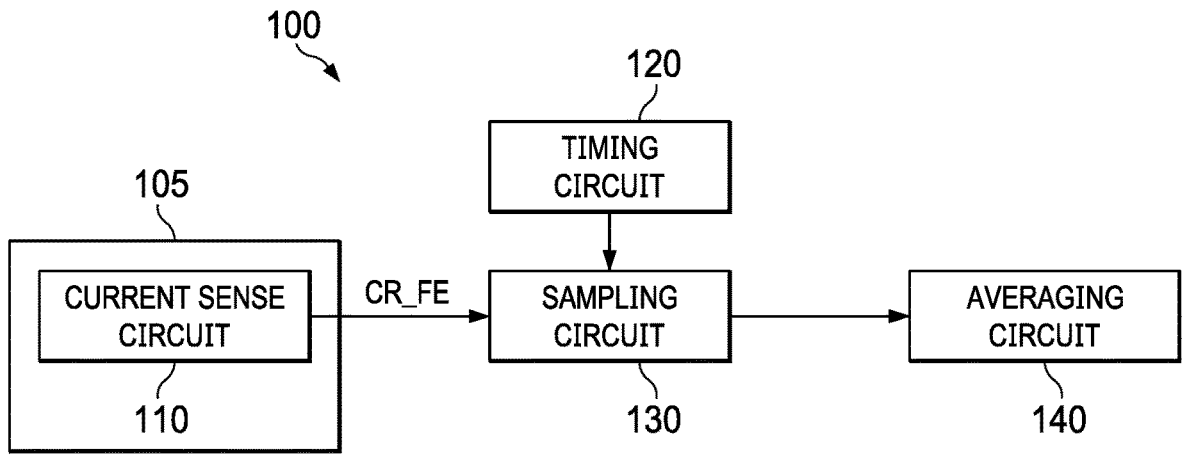
FIG. 1 illustrates an example device to sense average current.

The disclosure relates to current sensing and, more particularly to current sensing by averaging a front-end alternating current (AC) sensed signal (e.g., inductor current) over a plurality of cycles to produce an average sensed current. For example, a sampling circuit samples at least two sampling points of each cycle of a front-end AC sensed signal, the at least two sampling points being substantially symmetrical with respect to a midpoint of each respective cycle of the front-end AC sensed signal. A timing circuit controls a timing of the sampling circuit to sample the front-end AC sensed signal on the at least two sampling points. As used herein in the context of sampling points, the term "substantially symmetrical" refers to a relative position of sampling points with respect to a midpoint in which such points are intended to be equidistant (in time) from the midpoint, but some variations in circuit components and/or operating characteristics may cause some amount deviation (e.g., +/−5%) in actual sampling locations on a cycle-by-cycle basis. An averaging circuit averages the at least two sampling points for a given cycle of the front-end AC sensed signal to produce an average sensed current. Thus, the device avoids sensing current at a single point. Rather, the device senses current at a plurality of separate but matched timing instances, that is which are symmetrical around a mid-point of a particular cycle. Therefore, device is also not subject to speed limitation from a closed-loop control circuit, such as phase lock loop (PLL), of existing current sense devices.

Such a device provides for cycle-by-cycle and accurate average current sensing, which for power converters can facilitate achieving average current mode control to achieve fast response time for load transient and over current protection, as well as high precision telemetry reporting. Existing solutions include simple low-pass filtering of the front-end AC sensed signal, or sampling it at a single timing point when the current reaches its average value, i.e., the "mid-point". Thus, multiple sampling, i.e., the at least two sampling points of the examples described herein, is not being performed with existing solutions. In order to obtain an average or a mid-point value, existing solutions sample once at the mid-point where the average value is reached. Obtaining an average value by sampling multiple points away from the mid-point offers an advantage of tolerance to the existing solution's single mid-point timing error because the at least two timing points vary similarly and thus cancel out error within the single timing point and slope change around the mid-point, in an instance of a coupled inductor.

These solutions tend to suffer from limited speed and/or accuracy compared to the systems, devices and methods disclosed herein. In addition, for multi-phase power converters with coupled inductors, the current waveforms change shape around the mid-point depending on the coupling coefficient, which could further degrade the accuracy of the sensed average current for existing average current sensing approaches.

As used herein, the term "circuit" can include a collection of active and/or passive elements that perform a circuit function, such as an analog circuit or digital circuit. Additionally or alternatively, for example, the term "circuit" can refer to an integrated circuit (IC) where all and/or some of the circuit elements are fabricated on a common substrate (e.g., semiconductor substrate, such as a die or chip).

FIG. 1 illustrates an example device 100 to sense average current. The device 100 includes a current sense circuit 110 that senses an amount of current that is being produced by a front-end of a power converter 105, such as a front-end alternating current (AC) through an output inductor of the power converter 105. In an example, the current sense circuit 110 is part of the power converter 105 (e.g., implemented together in an integrated circuit (IC) chip). In this example, the current sense circuit 110 is a distinct part from the power converter 105. For example, the current sense circuit 110 senses the inductor current of the front-end during a sense period (e.g., a given AC cycle). In an example, the current sense circuit 110 outputs a CS_FE signal representing a front-end AC sensed signal during the sense period. For example, the CS_FE signal is an output of a low-side drain-source on resistance (Rds(on)) current sense, which represents inductor current when a low-side FET (not shown) of the power converter 105 is turned on to conduct current through the output inductor of the power converter 105.

In the example of FIG. 1, the device 100 further includes a sampling circuit 130. An input of the sampling circuit 130 is coupled to an output of the current sense circuit 110. The sampling circuit 130 receives the front-end AC sensed signal. The sampling circuit 130 samples at least two sampling points of each cycle of the front-end AC sensed signal associated with the power converter 105. These sampling points are substantially symmetrical with respect to a midpoint of each respective cycle of the front-end AC sensed signal.

The device 100 further includes a timing circuit 120. An output of the timing circuit 120 is coupled to an input of the sampling circuit 130. The timing circuit 120 controls a timing of the sampling circuit 130. In particular, the timing circuit 120 controls a timing of the sampling circuit 130 to sample the front-end AC sensed signal on the at least two sampling points for each cycle of the front-end AC sensed signal. In an example, the timing circuit 120 controls the timing of the sampling circuit such that sampling occurs at a predetermined time with respect to adjacent consecutive peaks of each cycle of the front-end AC sensed signal.

The device 100 further includes an averaging circuit 140. An input of the averaging circuit 140 is coupled to an output of the sampling circuit 130. The averaging circuit 140 averages the front-end AC sensed signal for the at least two sampling points for a given cycle of the front-end AC sensed signal on a cycle-by-cycle basis to provide an average indication of current CS_AVG. As a result of sensing the front-end AC sensed signal in the manner disclosed herein (e.g., around its mid-point), there is little (if any) impact on the average current CS_AVG by the shape of the front-end AC sensed signal. In an example, the averaging circuit 140 averages the at least two sampling points for a given cycle of the front-end AC sensed signal to produce an average sensed current.

Figure 2:
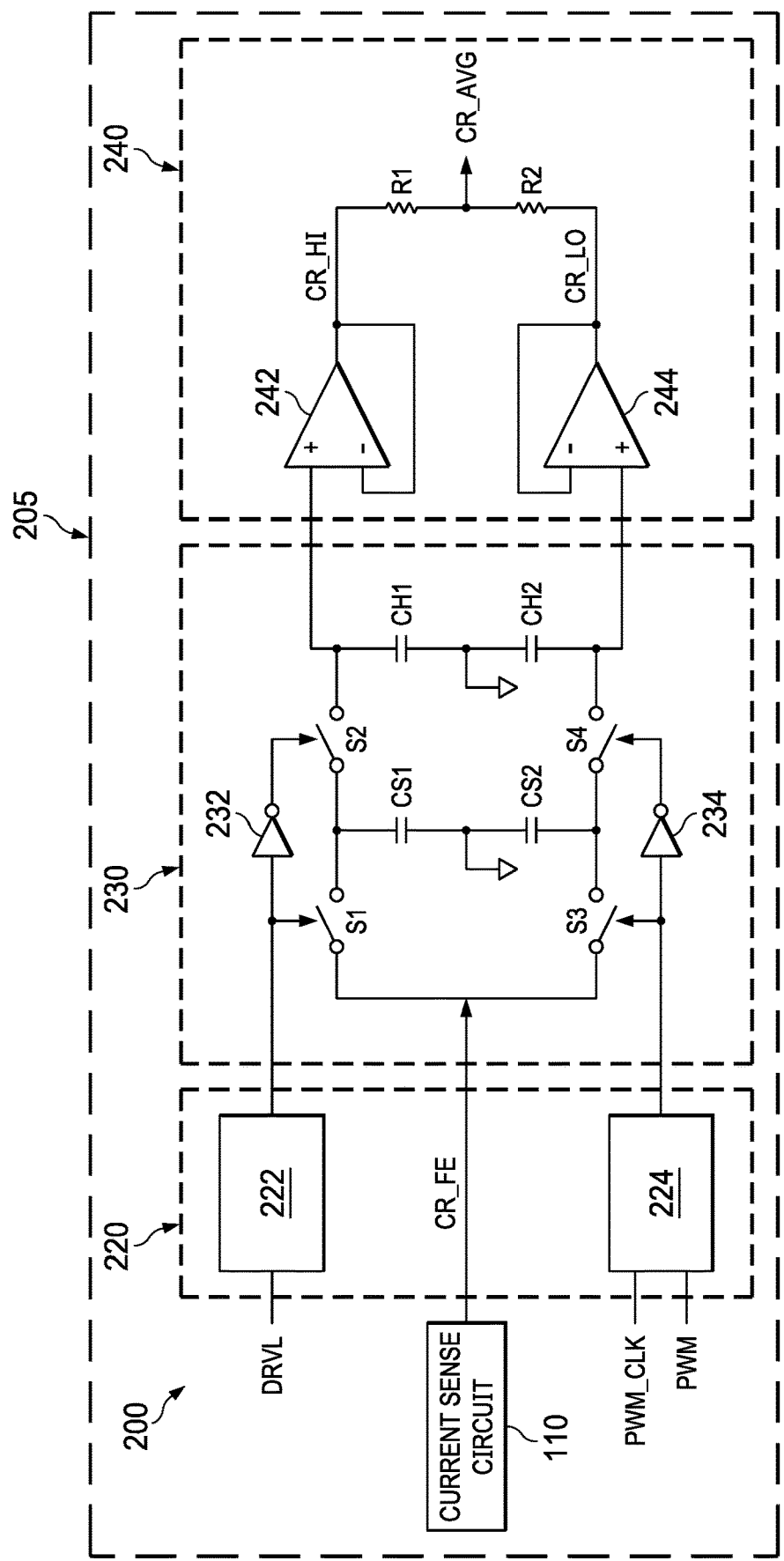
FIG. 2 illustrates an example device to sense average current.

FIG. 2 illustrates an example device 200 to sense average current of an AC current waveform (e.g., through an inductor of a power converter). The device 200 provides a particular implementation of one or more functional aspects of the device 100 although such an implementation does not limit the scope of the device 100. In this example, the device 200 includes a timing circuit 220. The timing circuit 220 includes first and second timing circuits 222 and 224, respectively. The first timing circuit 222 includes an input to receive a low side gate drive (DRVL) signal from the power converter 205. For example, the DRVL signal is a drive signal for a power FET (not shown) within the power converter 205. The second timing circuit 224 includes an input to receive a pulse width modulation clock (PWM_CLK) signal from drive circuitry of the power converter 205.

The first and second timing circuits 222 and 224 generate first and second timing signals, respectively. The first and second timing circuits 222 and 224 add delays Td1 and Td2, respectively, to the DRVL and PWM_CLK signals such that sampling of the CS_FE signal occurs at an offset time from respective positive and negative peaks of the CS_FE signal based on delays from rising edges of the DRVL and PWM_CLK signals. In this example, the device 200 is integrated within the power converter 205. In an example, the device 200 is coupled to the power converter 205.

The device 200 further includes a sampling circuit 230. The sampling circuit 230 includes first and second inputs that receive the first and second timing signals, respectively, from the first and second timing circuits 222 and 224. The sampling circuit 230 includes switching devices S1 and S2, with an inverter 232 positioned between the controls thereof. When switch S1 receives the first timing signal, switch S2 receives an inverted version of the timing signal, with switches S1 and S2 therefore switching opposite (mutually exclusively of) each other. The sampling circuit 230 further includes a first capacitor CS1 that is selectively coupled to receive the CS_FE signal based on the first timing signal, an opposite side of the first capacitor CS1 being coupled to a ground terminal. The sampling circuit 230 also includes a second capacitor CH2 that is selectively coupled to the first capacitor CS1, the opposite side of the second capacitor CH2 being coupled to the ground terminal.

By way of example, during a sampling phase of the device 200, the first switch S1 is activated by the first timing circuit 222 to apply the CS_FE signal to the first capacitor CS1 to sample the CS_FE signal and deactivated to remove application of the CS_FE signal to the first capacitor CS1. At the end of delay Td1, the first timing circuit 222 generates a rising edge of the first timing signal to transfer the sampled signal from the first capacitor CS1 to the second capacitor CH1 (e.g., a hold operation). The second switch S2 is activated to couple the first capacitor CS1 to the second capacitor CH1 to transfer charge, corresponding to the CS_FE signal, from the first capacitor CS1 to the second capacitor CH1. The current, corresponding to the CS_FE signal, is transferred from the first capacitor CS1 to the second capacitor CH1 during a hold phase of the device 200. While the first capacitor CS1 samples the CS_FE signal, the second capacitor CH1 maintains a previously sampled value at the input of associated averaging circuitry 240. During such sampling and holding that is performed on a cycle-by-cycle basis for the CS_FE signal, the first timing circuit 222 triggers a trimmed rising edge delay, a delay Td1, that is added to the DRVL signal to control operation of the switches S1 and S2.

The sampling circuit 230 further includes switching devices S3 and S4, with an inverter 234 therebetween. When switch S3 receives the second timing signal, switch S4 receives an inverted version of the timing signal, with switches S3 and S4 therefore switching opposite each other. The sampling circuit 230 further includes a third capacitor CS2 that is selectively coupled to the CS_FE signal based on the second timing signal, the opposite side of the third capacitor CS2 being coupled to a ground terminal. The sampling circuit 230 also includes a fourth capacitor CH2 that is selectively coupled to the third capacitor CS2, the opposite side of the fourth capacitor CH2 being coupled to a ground terminal.

As a further example, during a sampling phase of the device 200, the third switch S3 is activated by the second timing circuit 224 to apply the CS_FE signal to the third capacitor CS2 to sample the CS_FE signal and deactivated to remove application of the CS_FE signal to the third capacitor CS2. At the end of delay Td2, the second timing circuit 224 generates a rising edge of the second timing signal to transfer the sampled signal from the third capacitor CS1 to the fourth capacitor CH1. At the end of delay Td2, the PWM_CLK signal goes high and the DRVL signal goes low. The fourth switch S4 is activated to couple the third capacitor CS2 to the forth capacitor CH2 to transfer charge, corresponding to the CS_FE signal, from the third capacitor CS2 to the fourth capacitor CH2. The current, corresponding to the CS_FE signal, is transferred from the third capacitor CS2 to the fourth capacitor CH2 during a hold phase of the device 200. While the third capacitor CS2 samples the CS_FE signal, the fourth capacitor CH2 maintains a previously sampled value. During such sampling and holding that is performed on a cycle-by-cycle basis for the CS_FE signal, the second timing circuit 224 triggers a trimmed rising edge delay, delay Td2, that is added to the PWM_CLK signal to control operation of the switches S3 and S4.

The sampling circuit 230 includes first and second outputs coupled to the second and fourth capacitors CH1 and CH2, respectively. An interconnecting node between capacitors CH1 and CH2 is coupled to a ground terminal. Thus, sampling circuit 230 samples at least two sampling points of each cycle of the front-end AC sensed signal, in accordance with controlled timing of the switches S1-S4. The sampled voltages are held in capacitors CH1 and CH2 for averaging by averaging circuitry 240.

The averaging circuit 240 includes first and second amplifiers 242 and 244 (e.g., operational amplifiers), respectively. For example, non-inverting inputs of the first and second amplifiers 242 and 244 are coupled to the second and fourth capacitors CH1 and CH2, respectively. Inverting inputs of the amplifiers 242 and 244 are coupled with their respective outputs. The amplifiers 242 and 244 thus are configured to amplify a transferred charge from the second and fourth capacitors CH1 and CH2 and provide respective first and second amplified output signals. The positive inputs of the first and second amplifiers 242 and 244 are coupled to the first and second outputs of the sampling circuit 230, respectively. The negative inputs of the first and second amplifiers 242 and 244 are coupled to the outputs of the first and second amplifiers 242 and 244, respectively. When the sampled value of CS_FE signal on the sampling capacitor CS1 is transferred to the holding capacitor CH2, the first amplifier 242 buffers this value as an output CS_HI signal. Likewise, when the sampled value of CS_FE signal on the sampling capacitor CS2 is transferred to the holding cap, CH2, the second amplifier 244 buffers this value as an output CS_LO signal. The outputs of the first and second amplifiers 242 and 244 are also coupled one side of first and second resistors R1 and R2, the opposite side of the resistors R1 and R2 being coupled together thereby forming a voltage divider circuit. This voltage divider outputs a CS_AVG signal that represents a cycle-by-cycle average current produced by the power converter 205. In an example, a resistance of the first and second resistors R1 and R2 is approximately equal to provide a voltage division resulting in CS_AVG representing a cycle-by-cycle average of the symmetrically sampled points of the input current signal CS_FE.

The device 200 extracts an average value of the sensed current cycle by cycle, achieving high sensing bandwidth, which is can be used for current mode control and over current protection. As an example, the extracted average current value is updated twice every switching cycle. Additionally, the device 200 exacts the true and accurate value of the average current, regardless of waveform shape of the sensed current signal around its mid-point, because the at least sensing timings are outside of a shape changing region and are symmetrical with respect to the mid-point. Therefore, the device 200 provides a reliable and accurate current sensing solution for current telemetry, such as for in multi-phase converters with coupled inductors to reduce printed circuit board (PCB) board size. Moreover, the device 200 provides a sensing accuracy that is resistant to process and temperature variation. For example, the two timing delays, Td1 and Td2 are matched over both process and temperature by being trimmed to the same target, and by using same types of semiconductor components in the device.

Figure 3:
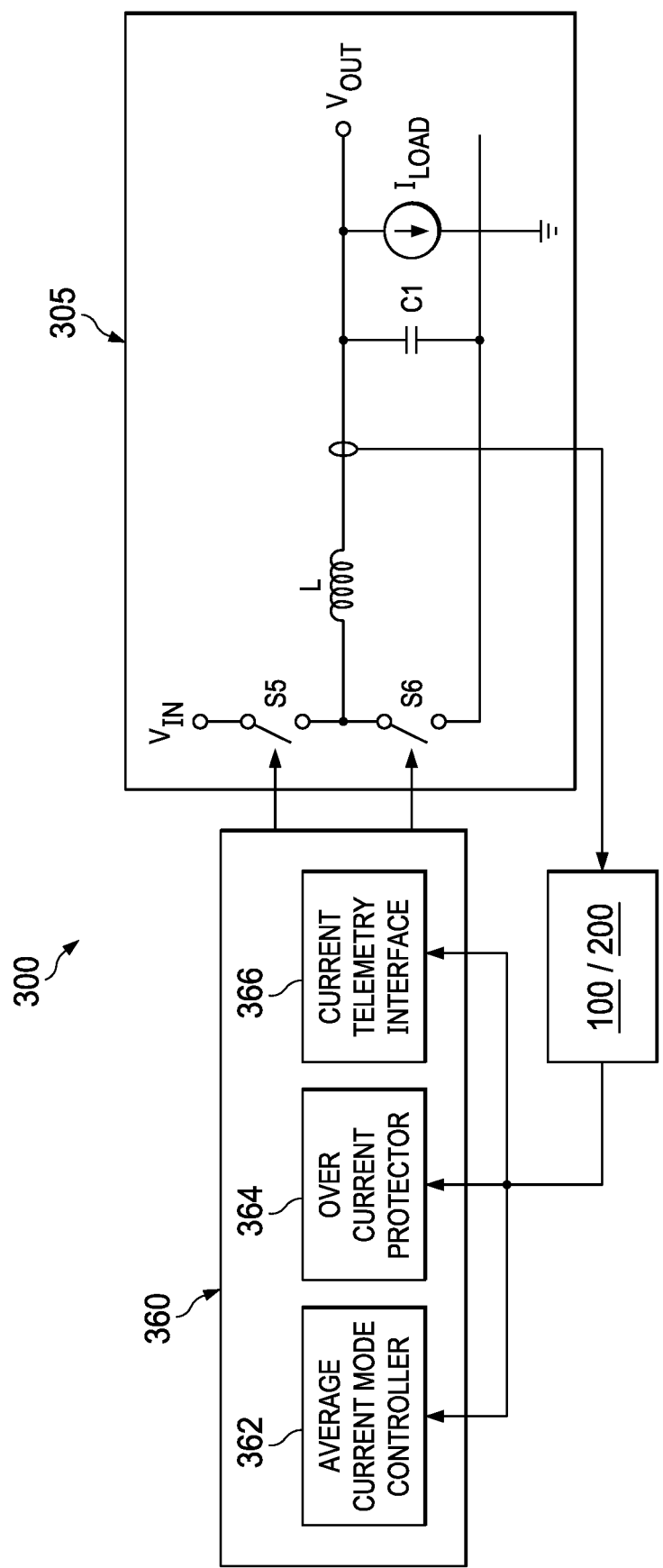
FIG. 3 illustrates an example system including a power converter coupled to the device illustrated in FIG. 1 or 2 to sense average current.

FIG. 3 illustrates an example system 300 including a power converter 305 coupled 305 to the device 100/200 illustrated in FIG. 1 or 2 to sense average current. The system 3000 includes three subsystems, the power converter (e.g., DC-DC converter), a controller 360, and the device 100/200. In this example, the power converter 305 is a buck converter.

The power converter 305 consists of two switches, S5 and S6, an inductor, L, and a capacitor, C1. One side of switch S5 is selectively coupled to an input voltage, VIN, and the other side of the switch S5 is coupled to the inductor L and to switch S6. The other side of switch S6 is coupled to a ground terminal. One side of the capacitor C1 is coupled to the inductor L and the other side of the capacitor C1 is coupled to the ground terminal. The power converter 305 converts the input voltage, VIN, to the output voltage, VOUT to provide the load current, ILOAD by controlling the duty cycles of switches S5 and S6 with a controller 360. The device 100/200 senses the cycle-by-cycle average current of the inductor, L.

The output of the device 100/200 is received by each of the illustrated components of the controller 360. The controller 360 includes an average current mode controller which determines the duty cycle of switches S5 and S6. The controller 360 further includes an over current protector 364 which turns off switches S5 and S6 if the sensed average current is higher than a pre-set safe threshold in order to protect switches S5 and S6 from being damaged from such higher than pre-set sage threshold current. The controller 360 further includes a current telemetry interface 366 which reports the sensed average current (e.g., in real time) through a digital interface.

Figure 4:
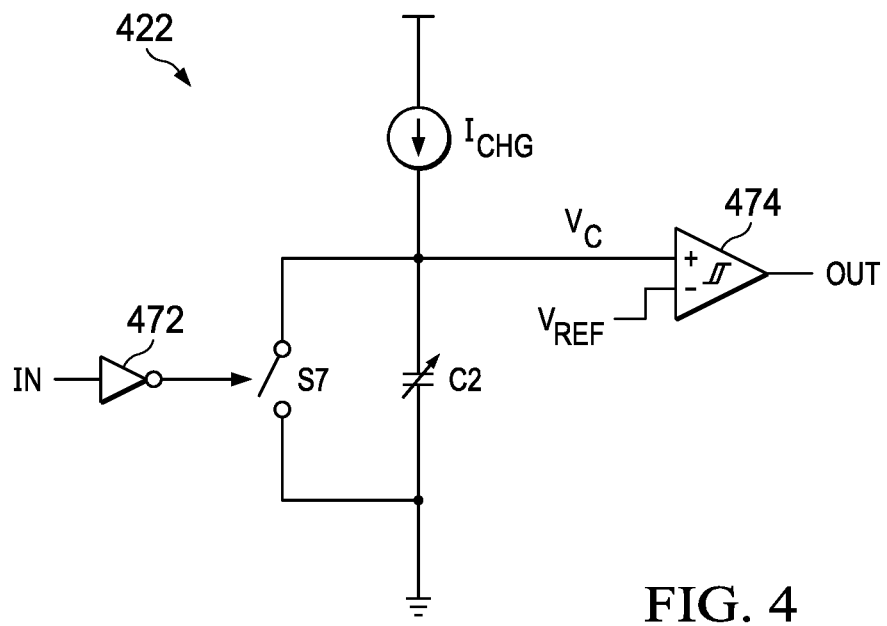
FIG. 4 illustrates an example timing circuit.
Figure 5:
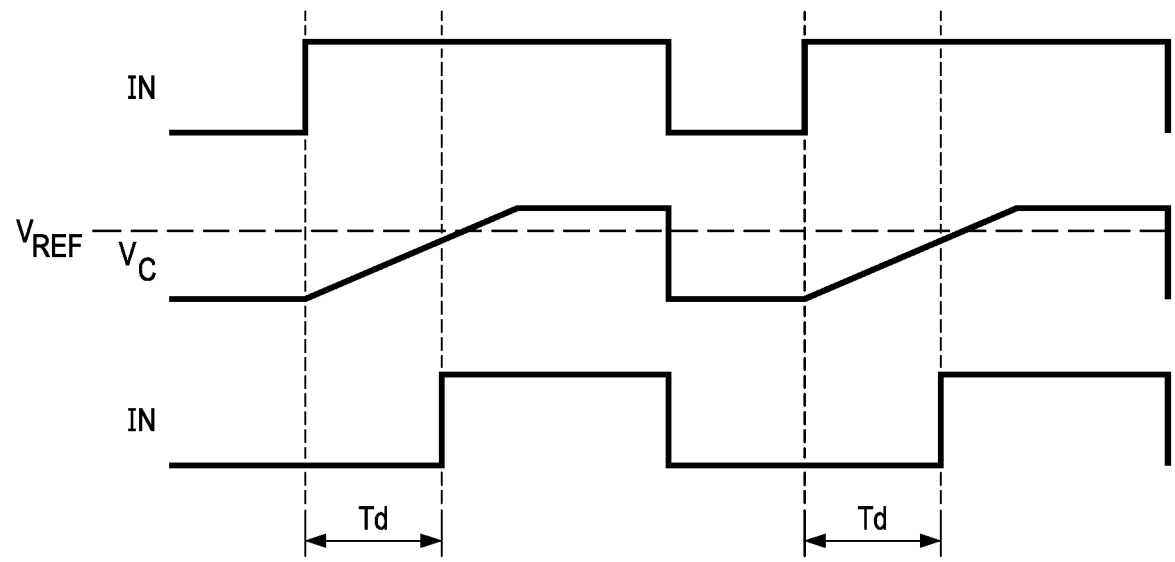
FIG. 5 illustrates examples of various signals of the timing circuit illustrated in FIG. 4.

FIG. 4 illustrates an example timing circuit 422. The timing circuit 422 can be used as the timing circuits 120/222/224 illustrated in FIGS. 1 and 2. FIG. 5 illustrates examples of various signals of the timing circuit 422 illustrated in FIG. 4. The timing circuit 422 and the various signals of the timing circuit 422 are discussed together. The timing circuit includes an inverter 472 coupled to a switch S7. In parallel with the switch S7 is a capacitor C2, one side of the capacitor C2 being coupled to a ground terminal and the other side of the capacitor C2 being coupled to a positive terminal of a comparator 474. The negative side of the comparator being coupled to a reference voltage, VREF.

The delay time, Td (e.g, Td1 and Td2), is determined by the charging current, ICHG, the capacitor, C2, and the reference voltage VREF. When the input signal, In, is low, the switch, S is on, shorting the capacitor voltage, VC to ground, therefore the comparator 472 output, Out, is low. When the input signal In goes high, the switch S7 is released, allowing ICHG to charge up VC. When VC goes above a preset reference voltage, VREF, the comparator 472 output, Out, goes high. The delay between the input signal In going high and the output of the comparator 472, Out, going high sets the delay time, Td. In an example, the capacitor C2 is trimmed during production so the process variation of Td is reduced.

Figure 6:
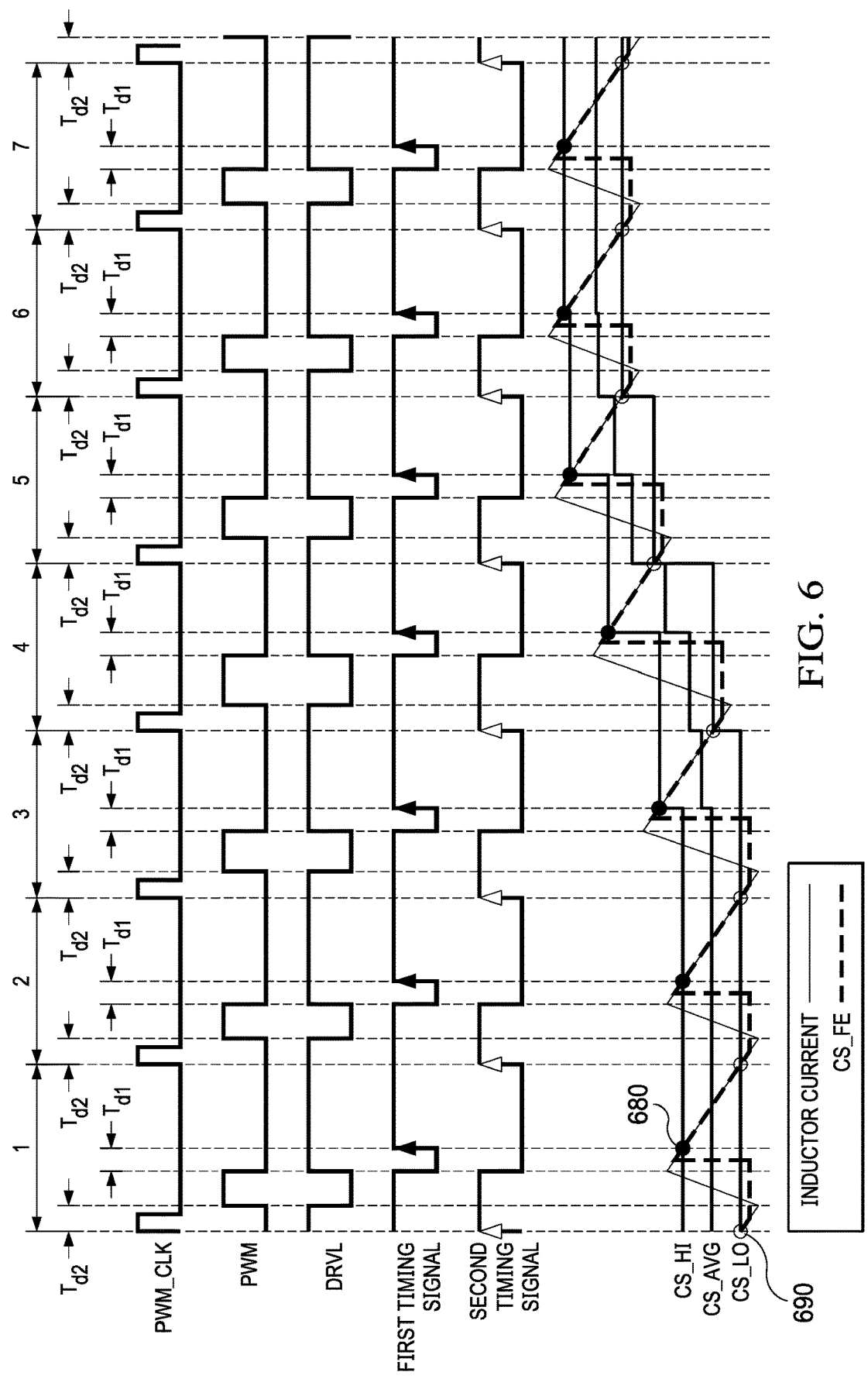
FIG. 6 illustrates examples of various signals from the device of FIG. 2.

FIG. 6 illustrates examples of various signals from the device 200 of FIG. 2. In particular, the PWM_CLK signal, PWM signal, DRVL signal, first and second timing signals for the switches S1-S4, CS_HI signal, CS_AVG signal, CS_LO signal, inductor current produced by the power converter 205, and CS_FE signal are illustrated in order from the top of FIG. 3 to the bottom. The CS_FE signal is illustrated as steady-state during cycles 1, 2 and 7 and in transient during cycles 3, 4, 5, and 6.

The delay Td1 corresponds to a prescribed amount of delay that is added to a rising edge of the DRVL signal to provide the first timing signal for activating the first switch S1 for sampling the CS_FE at a given point during a given cycle. Likewise, the delay Td2 corresponds to a prescribed amount of delay that is added to a rising edge of the PWM_CLK signal to activate switch S3 for sampling the CS_FE at another point during the given cycle. Sampling is illustrated as occurring during the rising edges of the first and second timing signals, for the first and second switches S1 and S2, and the third and fourth switches S3 and S4, respectively. In the example of FIG. 3, the CS_FE signal is illustrated as having a sawtooth pattern. Other AC waveforms may be used in other examples. Sampling on a falling edge of the CS_FE signal occurs at 680 which coincides with the rising edge of first timing signal for S1. Sampling on a falling edge of the CS_FE signal occurs at 690 which coincides with the rising edge of second timing signal for S3. The CS_AVG signal is the average of the CS_HI and CS_LO signals. As illustrated, the CS_AVG signal is immune to fluctuations in peaks of the CS_FE signal as sampling occurs at delays from such peaks.

Figure 7:
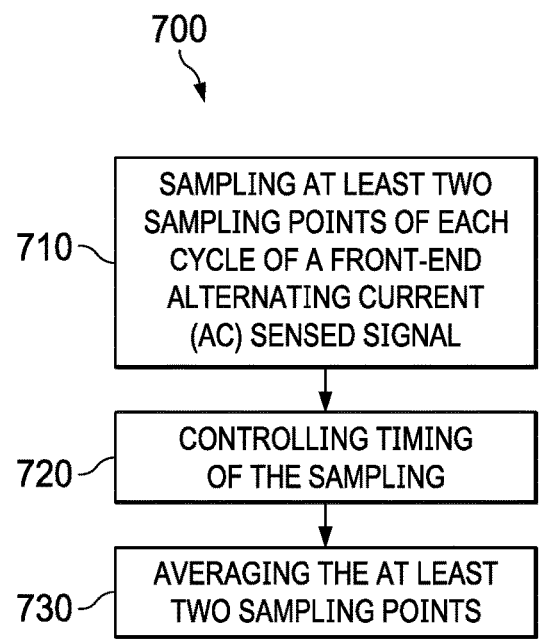
FIG. 7 illustrates an example method of processing sensed current.

In view of the foregoing structural and functional features described above, a method will be better appreciated with reference to FIG. 7. While, for purposes of simplicity of explanation, the method of FIG. 7 is shown and described as executing serially, the method is not limited by the illustrated order, as some aspects may, in other examples, occur in different orders and/or concurrently from that shown and described herein. Moreover, not all illustrated features may be required to implement the method of FIG. 7. Further, the method of FIG. 7 may include additional features as described above in accordance with FIGS. 1-4. The method 700 can be implemented by various hardware circuitry and components including one or more integrated circuit, a controller or a processor, for example.

FIG. 7 illustrates an example method 700 of sensing average current, e.g., for a power converter 105/205. At 710, the method 700 includes sampling at least two sampling points of each cycle of the front-end AC sensed signal, the at least two sampling points being substantially symmetrical with respect to a midpoint of each respective cycle of the front-end AC sensed signal. In an example, the sampling circuit 130/230 receives the front-end AC sensed signal and samples at least two sampling points of each cycle of the front-end AC sensed signal. In an example, the sampling circuit 230 includes four switches S1-S4 and four capacitors C1-C4, with timing of the four switches S1-S4 being controlled to sample and hold at least two sampling points of each cycle of the front-end AC sensed signal.

At 720, the method 700 further includes controlling timing of the sampling of the front-end AC sensed signal such that the at least two sampling points are substantially symmetrical with respect to a midpoint of each respective cycle of the front-end AC sensed signal. In an example, the timing circuit 120 controls a timing of the sampling circuit 130 to sample the front-end AC sensed signal on the at least two sampling points for each cycle of the front-end AC sensed signal. In an example, the first and second timing circuits 222 and 224 generate first and second timing signals, respectively, adding delays Td1 and Td2, respectively, to the DRVL and PWM_CLK signals such that sampling of the CS_FE signal occurs at a predetermined time with respect to adjacent consecutive peaks of each cycle of the front-end AC sensed signal. The first timing circuit 222 receives the second timing signal generated by the second timing circuit 224 as a basis for generating the first timing signal.

At 730, the method 700 further includes averaging the at least two sampling points cycle-by-cycle to produce an average sensed current. In an example, the averaging circuit 140 averages the front-end AC sensed signal for the at least two sampling points, with the averaging circuit 140 averages the front-end AC sensed signal over a plurality of cycles to produce the CR_AVG signal. In an example, the first and second amplifiers 242 and 244 are coupled to the second and fourth capacitors CH1 and CH2, respectively, to amplify a transferred charge from the second and fourth capacitors CH1 and CH2 and provide respective first and second amplified output signals. These first and second output signals, CS_LO and CS_HI are averaged to produce the CS_AVG signal.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A device, comprising:
   a sampling circuit configured to sample at least two sampling points of each cycle of a front-end alternating current (AC) sensed signal, the at least two sampling points being substantially symmetrical with respect to a midpoint of each respective cycle of the front-end AC sensed signal;
   a timing circuit configured to control a timing of the sampling circuit to sample the front-end AC sensed signal on the at least two sampling points based on a timing signal generated by the timing circuit; and
   an averaging circuit that averages the at least two sampling points for a given cycle of the front-end AC sensed signal to produce an average sensed current.

2. The device of claim 1, wherein the timing circuit controls the timing of the sampling circuit to occur at a predetermined time with respect to adjacent consecutive peaks of each cycle of the front-end AC sensed signal.

3. The device according to claim 1, further comprising a current sensing circuit to sense an amount of current being produced by a power converter and produce the front-end AC sensed signal based on the sensed amount of current being produced by the power converter.

4. The device according to claim 1, wherein the sampling circuit samples first and second sampling points on a rising edge of the front-end AC sensed signal.

5. The device of claim 1, wherein the sampling circuit samples an inductor current representing the front-end AC sensed signal during a sense period.

6. The device of claim 1, further comprising a power converter, the averaging circuit averages the at least two sampling points twice for every switching cycle of a power converter.

7. The device of claim 1, wherein the device is integrated within a power converter.

8. A method, comprising:
    sampling at least two sampling points of each cycle of a front-end alternating current (AC) sensed signal;
    controlling timing of the sampling of the front-end AC sensed signal such that the at least two sampling points are substantially symmetrical with respect to a midpoint of each respective cycle of the front-end AC sensed signal; and
    averaging the at least two sampling points cycle-by-cycle to produce an average sensed current.

9. The method of claim 8, wherein the controlling the sampling occurs at a predetermined time with respect to adjacent consecutive peaks of each cycle of the front-end AC sampling signal.

10. A device, comprising:
    first and second switches that switch opposite each other, the first switch configured to apply a front-end alternating current (AC) sense signal to a first capacitor, the second switch activated opposite the first switch to couple the first capacitor to a second capacitor to transfer charge from the first capacitor to the second capacitor;
    third and fourth switches that switch opposite each other, the third switch configured to applying the front-end AC sensed signal to a third capacitor and deactivated to remove application of the front-end AC sensed signal to the third capacitor, the fourth switch activated to couple the third capacitor to a fourth capacitor to transfer charge from the third capacitor to the fourth capacitor;
    first and second amplifiers coupled to the second and fourth capacitors, respectively, to amplify a signal from the second and fourth capacitors and provide respective first and second amplified output signals; and
    a voltage divider circuit, coupled between outputs of the first and second amplifiers, configured to provide an output signal corresponding to an average current based on the first and second amplified output signals.

11. The device of claim 10, wherein the voltage divider circuit includes first and second resistors, the first resistor coupled between the output of the first amplifier and the output of the device and the second resistor coupled between the output of the second amplifier and the output of the device, a resistance of the first and second resistors being approximately equal.

12. The device of claim 10, wherein the first and second amplifiers are operational amplifiers.

13. The device of claim 10, further comprising an inverter coupled between the first and second switches.

14. The device of claim 10, further comprising an inverter coupled between the third and fourth switches.

15. The device of claim 10, wherein the device is integrated with a power converter.

16. The device of claim 10, further comprising a timing circuit configured to control a timing of the first, second, third, and fourth switches based on a timing signal generated by the timing circuit.

17. The device of claim 10, wherein an output of each of the first and second amplifiers is coupled to a negative input of each of the first and second amplifiers, respectively.

* * * * *